United States Patent
Lee et al.

(10) Patent No.: US 10,074,737 B2
(45) Date of Patent: Sep. 11, 2018

(54) FLEXIBLE DEVICE INCLUDING TWO-DIMENSIONAL MATERIAL AND METHOD OF MANUFACTURING THE SAME

(71) Applicant: Samsung Electronics Co., Ltd., Suwon-si, Gyeonggi-do (KR)

(72) Inventors: Jaeho Lee, Seoul (KR); Kiyoung Lee, Seoul (KR); Sangyeob Lee, Hwaseong-si (KR); Eunkyu Lee, Yongin-si (KR); Jinseong Heo, Seoul (KR); Seongjun Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/932,392

(22) Filed: Nov. 4, 2015

(65) Prior Publication Data

US 2016/0322486 A1    Nov. 3, 2016

(30) Foreign Application Priority Data

Apr. 30, 2015 (KR) .................. 10-2015-0062010

(51) Int. Cl.
*H01L 23/00* (2006.01)
*H01L 29/778* (2006.01)
(Continued)

(52) U.S. Cl.
CPC ........ *H01L 29/778* (2013.01); *H01L 29/1606* (2013.01); *H01L 29/66045* (2013.01); *H01L 29/66477* (2013.01)

(58) Field of Classification Search
CPC .............. H01L 21/6835; H01L 29/778; H01L 29/1606; H01L 23/00; H01L 29/66; H01L 29/06; H01L 29/66045; H01L 29/66477
See application file for complete search history.

(56) References Cited

U.S. PATENT DOCUMENTS

| 8,405,133 B2 | 3/2013 | Chung et al. |
| 2012/0248414 A1* | 10/2012 | Kim ...................... B82Y 10/00 257/29 |

(Continued)

FOREIGN PATENT DOCUMENTS

| KR | 20130039119 A | 4/2013 |
| KR | 20130086807 A | 8/2013 |

(Continued)

OTHER PUBLICATIONS

Liao, et al. "Graphene-Dielectric Integration for Graphene Transistors," Materials Science and Engineering R. Rep. vol. 70(3-6), pp. 354-370, (2010).

*Primary Examiner* — Fazli Erdem
(74) *Attorney, Agent, or Firm* — Harness, Dickey & Pierce, P.L.C.

(57) ABSTRACT

A method of manufacturing a flexible device including a two-dimensional (2D) material, e.g., graphene, includes forming a dielectric layer on a first substrate, forming a two-dimensional (2D) material layer on the dielectric layer; forming a pattern in the 2D material layer, forming a second substrate on the dielectric layer and the 2D material layer, the first substrate including a flexible material, removing the first substrate, and forming a source electrode, a drain electrode, and a gate electrode on the dielectric layer.

12 Claims, 15 Drawing Sheets

(51) Int. Cl.
 *H01L 29/66* (2006.01)
 *H01L 29/16* (2006.01)

(56) References Cited

U.S. PATENT DOCUMENTS

| | | | | |
|---|---|---|---|---|
| 2013/0161587 A1* | 6/2013 | Xianyu | ............ | H01L 29/66742 257/29 |
| 2013/0193411 A1* | 8/2013 | Lee | .................... | H01L 21/6835 257/29 |
| 2013/0193412 A1* | 8/2013 | Lee | .................... | H01L 21/6835 257/29 |
| 2014/0225193 A1* | 8/2014 | Chu | ................. | H01L 29/66742 257/347 |
| 2014/0252415 A1 | 9/2014 | Nayfeh | | |
| 2014/0291282 A1* | 10/2014 | Bedell | ................... | B32B 43/006 216/2 |
| 2014/0339506 A1* | 11/2014 | Dimitrakopoulos | ........................ | H01L 29/1606 257/29 |
| 2015/0214482 A1* | 7/2015 | Park | ..................... | H01L 51/002 257/9 |
| 2015/0243853 A1* | 8/2015 | Cha | ....................... | H01L 33/486 438/27 |

FOREIGN PATENT DOCUMENTS

| | | |
|---|---|---|
| KR | 20140010720 A | 1/2014 |
| KR | 20140102990 A | 8/2014 |
| KR | 20140118513 A | 10/2014 |
| KR | 20150056372 A | 5/2015 |

\* cited by examiner

FLEXIBLE DEVICE INCLUDING TWO-DIMENSIONAL MATERIAL AND METHOD OF MANUFACTURING THE SAME

CROSS-REFERENCE TO RELATED APPLICATION

This application claims the benefit of Korean Patent Application No. 10-2015-0062010, filed on Apr. 30, 2015, in the Korean Intellectual Property Office, the disclosure of which is incorporated herein in its entirety by reference.

BACKGROUND

1. Field

Example embodiments relate to flexible devices including two-dimensional (2D) materials, e.g., graphene, and methods of manufacturing the same.

2. Description of the Related Art

Recently, next-generation materials, for example, two-dimensional (2D) materials, e.g., graphene and carbon nanotube (CNT), have been actively studied. Graphene, which has a hexagonal single-layer structure formed of carbon atoms, may exhibit structurally/chemically stable characteristics and electrically/physically excellent characteristics. For example, graphene may have a charge mobility (e.g. ~$2 \times 10^5$ cm$^2$/Vs) that is 100 times or greater than that of silicon (Si) and a current density (e.g. about $10^8$ A/cm$^2$) that is 100 times or greater than that of copper (Cu). Also, graphene may have flexible characteristics and excellent transparency. Accordingly, graphene has been highlighted as a next-generation material that may overcome the limits of materials of the related art.

Due to various advantages of next-generation materials, e.g., graphene, research on applying these next-generation materials to various semiconductor devices and electronic devices has been under progress. For example, research on using graphene as a channel material for transistors has been conducted. In this regard, research and development of elements of transistors besides channels thereof are required.

SUMMARY

Example embodiments provide semiconductor devices that have relatively constant film quality as dielectric layers are formed first and then two-dimensional (2D) materials are formed through transfer or growth and methods of manufacturing the same.

Example embodiments also provide semiconductor devices including graphene having increased degrees of freedom in performing relatively high temperature processes and methods of manufacturing the same.

Additional aspects will be set forth in part in the description which follows and, in part, will be apparent from the description, or may be learned by practice of the example embodiments.

According to example embodiments, a method of manufacturing a flexible device includes forming a dielectric layer on a first substrate, forming a two-dimensional (2D) material layer on the dielectric layer, forming a pattern in the 2D material layer, forming a second substrate on the dielectric layer and the 2D material layer, the second substrate including a flexible material, removing the first substrate, and forming a source electrode, a drain electrode, and a gate electrode on the dielectric layer.

Forming the source electrode, the drain electrode, and the gate electrode may include forming a source electrode pattern and a drain electrode pattern on the dielectric layer, the source electrode pattern and the drain electrode pattern separate from each other, forming the source electrode and the drain electrode on the source electrode pattern and the drain electrode pattern, respectively, and forming the gate electrode on the dielectric layer between the source electrode pattern and the drain electrode pattern.

The first substrate may include silicon.

Forming the 2D material layer may form the 2D material layer by one of transferring the 2D material layer on the dielectric layer and directly forming the 2D material layer on the dielectric layer.

The 2D material layer may include at least one of graphene and transition-metal dichalcogenide (TMD).

The method may further include forming a protective layer on the source electrode, the drain electrode, the gate electrode and the dielectric layer, the protective layer including a flexible material.

The method may further include forming an align key on the dielectric layer.

The align key may be formed of metal.

According to example embodiments, a method of manufacturing a flexible device includes forming a buffer layer on a first substrate, forming a dielectric layer on the buffer layer, forming a two-dimensional (2D) material layer on the dielectric layer, forming a pattern in the 2D material layer, forming a second substrate on the dielectric layer and the 2D material layer, the second substrate including a flexible material, removing the buffer layer and the second substrate, and forming a source electrode, a drain electrode, and a gate electrode on the dielectric layer.

Forming the source electrode, the drain electrode, and the gate electrode may include forming a source electrode pattern and a drain electrode pattern on the dielectric layer, the source electrode pattern and the drain electrode being separate from each other, forming the source electrode and the drain electrode on the source electrode pattern and the drain electrode pattern, respectively, and forming the gate electrode on the dielectric layer between the source electrode pattern and the drain electrode pattern.

The first substrate may include silicon.

Forming the 2D material layer may form the 2D material layer by one of transferring the 2D material layer on the dielectric layer and directly forming the 2D material layer on the dielectric layer.

The 2D material layer may include at least one of graphene and transition-metal dichalcogenide (TMD).

The method may further include forming a protective layer on the source electrode, the drain electrode, the gate electrode and the dielectric layer, the protective layer including a flexible material.

The method may further include forming an align key on the dielectric layer.

The align key may be formed of metal.

According to example embodiments, a flexible device includes a first substrate including a flexible material, a two-dimensional (2D) material layer in the first substrate, a dielectric layer on the first substrate, the dielectric layer being in contact with the 2D material layer, a source electrode pattern and a drain electrode pattern on the dielectric layer, the source electrode pattern and the drain electrode pattern being separate from each other, a source electrode and a drain electrode on the source electrode pattern and the drain electrode pattern, respectively, and a gate electrode on the dielectric layer between the source electrode pattern and the drain electrode pattern.

The 2D material layer may include at least one of graphene and transition-metal dichalcogenide (TMD).

The device may further include a protective layer on the source electrode, the drain electrode, and the gate electrode on the dielectric layer, the protective layer including a flexible material.

The device may further include an align key in the first substrate.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Figure 1:
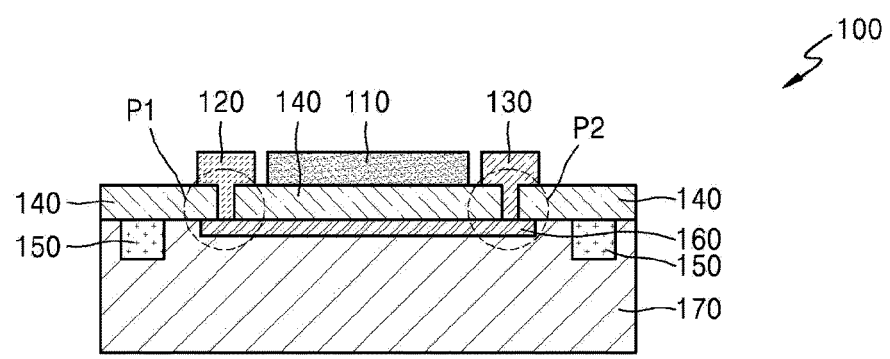
FIG. 1 is a schematic cross-sectional view of a flexible device including a two-dimensional (2D) material, e.g., graphene, according to example embodiments.

Hereinafter, example embodiments will be described in detail with reference to the accompanying drawings so that one of ordinary skill in the art may perform the example embodiments relatively easily. However, the present example embodiments may have different forms and should not be construed as being limited to the descriptions set forth herein. Also, parts unrelated to the detailed description are omitted in the drawings to ensure clarity of the present example embodiments. Like reference numerals in the drawings denote like elements, and thus, their description will not be repeated.

Throughout the specification, it will be understood that when an element is referred to as being "connected" to another element, it may be "directly connected" to the other element or "optically connected" to the other element with intervening devices therebetween. It will be further understood that when a part "includes" or "comprises" an element, unless otherwise defined, the part may further include other elements, not excluding the other elements.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises", "includes", "including" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made in detail to example embodiments, examples of which are illustrated in the accompanying drawings.

FIG. 1 is a schematic cross-sectional view of a flexible device 100 including a two-dimensional (2D) material, e.g., graphene, according to example embodiments.

Referring to FIG. 1, the flexible device 100 may include a first substrate 170, a 2D material layer 160, an align key 150, a dielectric layer 140, a source electrode 120, a drain electrode 130, and a gate electrode 110.

The first substrate 170 may be a flexible substrate including a flexible material. The first substrate 170 may be formed of a polymer, which is a flexible material. For example, the first substrate 170 may be formed of polyethylenenaphthalate (PEN), polyethyleneterephtalate (PET), polycarbonate, polyvinylalcohol, polyacrylate, polyimide, polynorbornene, or polyethersulfone (PES).

The 2D material layer 160 and the align key 150 may be embedded in the first substrate 170. In the case that the 2D material layer 160 and the align key 150 are embedded in the first substrate 170, the first substrate 170 may exhibit flexible or stretchable characteristics.

Regarding the flexible device 100 according to example embodiments, as will be described later, since the 2D material layer 160 and the align key 150 are formed first, and then, the first substrate 170 is formed, the 2D material layer 160 and the align key 150 may be embedded in the first substrate 170.

The 2D material layer 160 may be formed of a 2D material, and the 2D material may be graphene or transition-metal dichalcogenide (TMD). The 2D material layer 160 may be formed by transferring graphene manufactured by chemical vapor deposition (CVD) on the dielectric layer 140 and then patterning the graphene. The 2D material layer 160 that is formed of graphene may be a passage for carriers and may have a zero bandgap. Alternatively, the 2D material layer 160 may be directly formed on the dielectric layer 140.

The align key 150 may be used to align a semiconductor substrate with a mask accurately in a manufacturing process of a semiconductor device. Also, when a source electrode pattern P1 and a drain electrode pattern P2 are formed in the dielectric layer 140, the align key 150 may be used to determine the positions of the patterns P1 and P2. In addition, the align key 150 may be formed of metal.

The dielectric layer 140 may be disposed on the first substrate 170 and may be in contact with the 2D material layer 160 and the align key 150. The dielectric layer 140 may be formed of silicon oxide, silicon nitride, or a polymer, e.g., poly(methyl methacrylate) (PMMA) or poly(2-hydroxyethyl methacrylate) (PHEMA).

The source electrode 120 and the drain electrode 130 may be respectively formed on the source electrode pattern P1 and the drain electrode pattern P2 that are separated from each other on the dielectric layer 140. The source electrode 120 and the drain electrode 130 may respectively contact two ends of the 2D material layer 160 in the source electrode pattern P1 and the drain electrode pattern P2.

The gate electrode 110 may be formed on the dielectric layer 140 formed between the source electrode pattern P1 and the drain electrode pattern P2.

FIGS. 2A to 2F are cross-sectional views of operations of a method of manufacturing a flexible device including a 2D material, e.g., graphene, according to example embodiments.

Figure 2A:
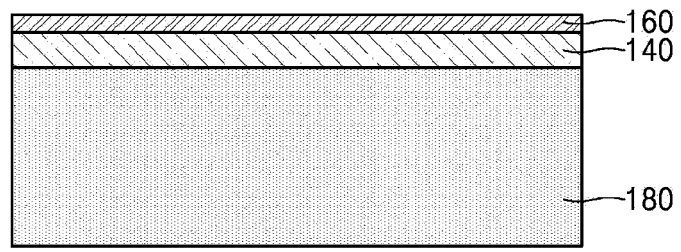
FIGS. 2A to 2F are cross-sectional views of operations of a method of manufacturing a flexible device including a 2D material, e.g., graphene, according to example embodiments.

Referring to FIG. 2A, a dielectric layer 140 and a 2D material layer 160 may be formed on a second substrate 180. The second substrate 180 may be a semiconductor substrate or an insulating substrate. The semiconductor substrate may be, for example, a silicon substrate. The type of the second substrate 180 is not limited thereto and may be variously changed.

The dielectric layer 140 may be formed by atomic layer deposition (ALD).

The 2D material layer 160 may be formed by transferring a 2D material manufactured by CVD on the dielectric layer 140 or by directly forming a 2D material on the dielectric layer 140. The 2D material may be graphene or TMD.

Figure 2B:
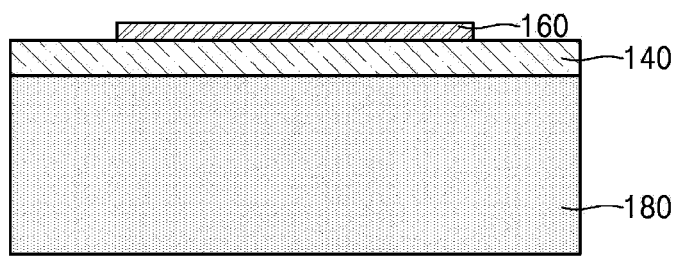

Referring to FIG. 2B, patterns may be formed in a 2D material that is formed on the dielectric layer 140 so that the 2D material may be used as the 2D material layer 160. The form of patterns in the 2D material layer 160 is not limited to that illustrated in FIG. 2B, and the 2D material layer 160 may have various forms of patterns.

Figure 2C:
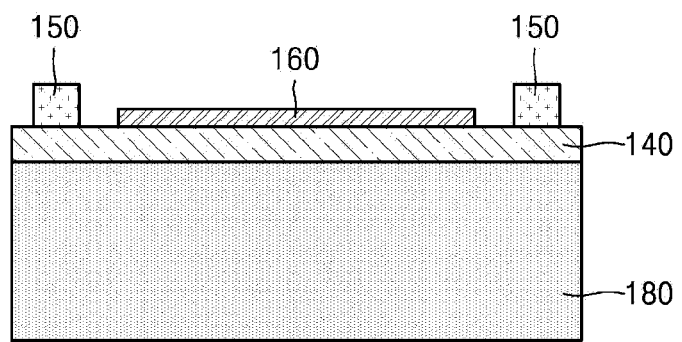

Referring to FIG. 2C, an align key 150 may be formed on the dielectric layer 140. The align key 150 may be used to accurately align a semiconductor substrate with a mask in a manufacturing process of a semiconductor device. Also, when a source electrode pattern P1 and a drain electrode pattern P2 are formed in the dielectric layer 140, the align key 150 may be used to determine the positions of the patterns P1 and P2. The align key 150 may be formed of metal.

Figure 2D:
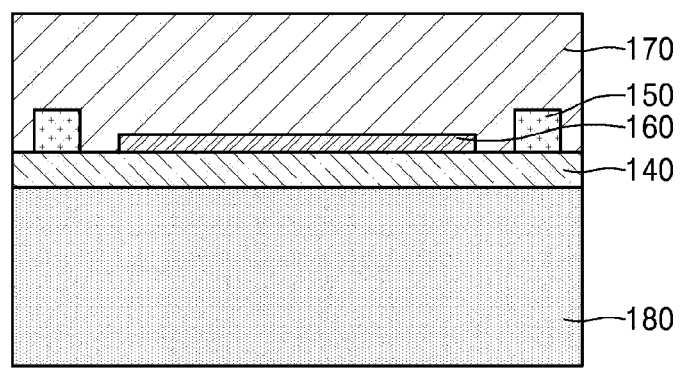

Referring to FIG. 2D, a first substrate 170 may be formed on the dielectric layer 140, the 2D material layer 160, and the align key 150. The first substrate 170 may be formed of a polymer, which is a flexible material. For example, the first substrate 170 may be formed of PEN, PET, polycarbonate, polyvinylalcohol, polyacrylate, polyimide, polynorbornene, or PES.

Figure 2E:
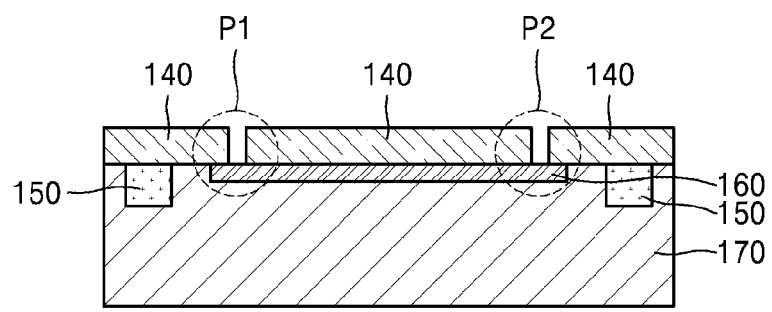

Referring to FIG. 2E, the device of FIG. 2D may be turned upside down to remove the second substrate 180. After the second substrate 180 is removed, the source electrode pattern P1 and the drain electrode pattern P2 may be formed in the dielectric layer 140. The source electrode pattern P1 and the drain electrode pattern P2 may be formed at ends of the 2D material layer 160 from among portions of the dielectric layer 140 that contact the 2D material layer 160.

Figure 2F:
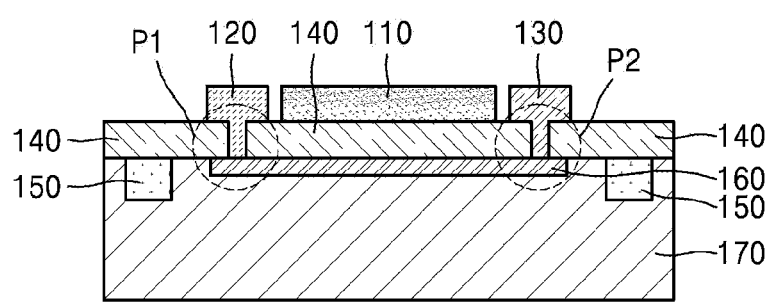

Referring to FIG. 2F, a source electrode 120 and a drain electrode 130 may be formed on the source electrode pattern P1 and the drain electrode pattern P2 on the dielectric layer 140. Each of lower end portions of the source electrode 120 and the drain electrode 130 may be in contact with the 2D material layer 160.

A gate electrode 110 may be formed on the dielectric layer 140 that is formed between the source electrode pattern P1 and the drain electrode pattern P2.

FIGS. 3A to 3G are cross-sectional views of operations of a method of manufacturing a flexible device in which 2D materials including graphene are used, according to example embodiments.

Figure 3A:
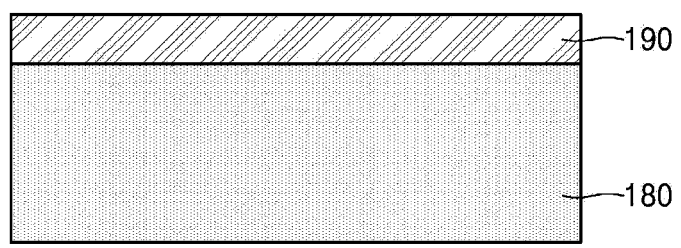
FIGS. 3A to 3G are cross-sectional views of operations of a method of manufacturing a flexible device including a 2D material, e.g., graphene, according to example embodiments.

Referring to FIG. 3A, a buffer layer 190 may be formed on a second substrate 180. The second substrate 180 may be a semiconductor substrate or an insulating substrate. The semiconductor substrate may be, for example, a silicon substrate. The type of the second substrate 180 is not limited thereto and may be variously changed. The buffer layer 190 may be formed of a material that may be removed from a dielectric layer 140 easily.

Figure 3B:
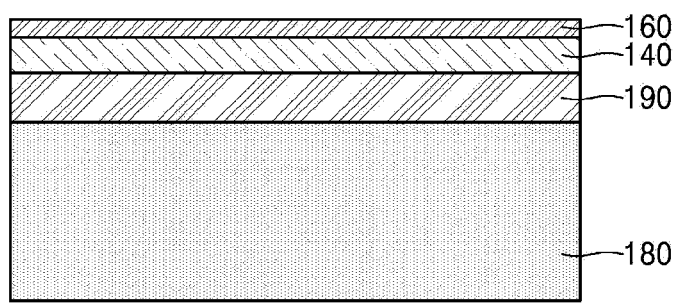

Referring to FIG. 3B, the dielectric layer 140 and a 2D material layer 160 may be formed on the buffer layer 190. The dielectric layer 140 may be formed by ALD. The 2D material layer 160 may be formed by transferring a 2D material manufactured by CVD on the dielectric layer 140 or by directly forming a 2D material on the dielectric layer 140. The 2D material may be graphene or TMD.

Figure 3C:
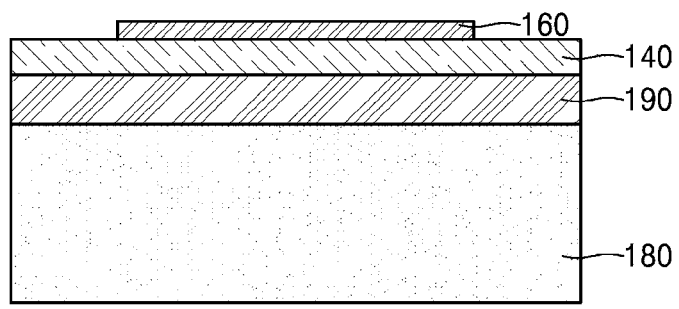

Referring to FIG. 3C, patterns may be formed in a 2D material formed on the dielectric layer 140 to form the 2D material layer 160. The patterns formed in the 2D material layer 160 are not limited to those illustrated in FIG. 3C, and the 2D material layer 160 may have various patterns.

Figure 3D:
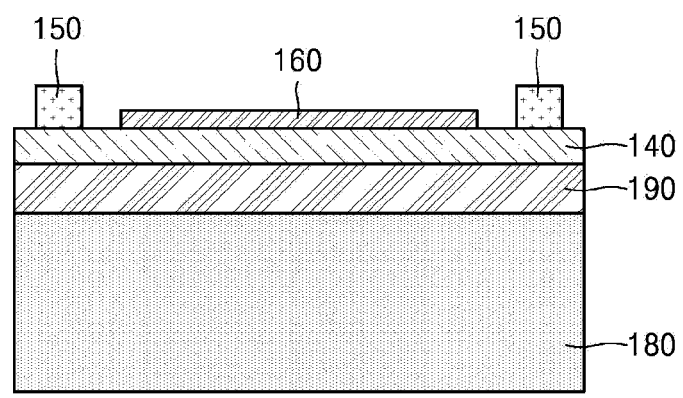

Referring to FIG. 3D, an align key 150 may be formed on the dielectric layer 140. The align key 150 may be used to accurately align a semiconductor substrate with a mask in a manufacturing process of a semiconductor device. Also, when a source electrode pattern P1 and a drain electrode pattern P2 are formed in the dielectric layer 140, the align key 150 may be used to determine the positions of the patterns P1 and P2. In addition, the align key 150 may be formed of metal.

Figure 3E:
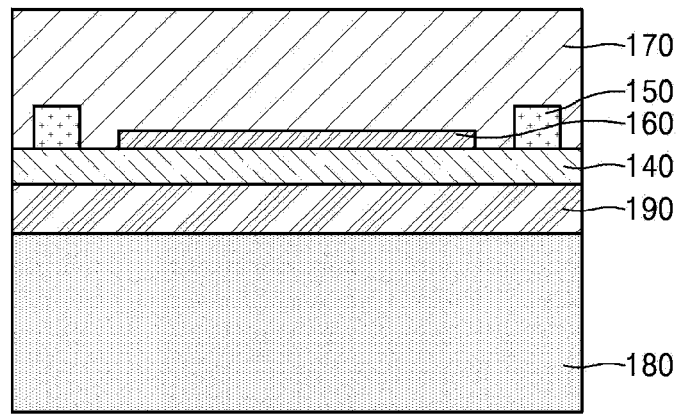

Referring to FIG. 3E, a first substrate 170 may be formed on the dielectric layer 140, the 2D material layer 160, and the align key 150. The first substrate 170 may be formed of a polymer, which is a flexible material. For example, the first substrate 170 may be formed of PEN, PET, polycarbonate, polyvinylalcohol, polyacrylate, polyimide, polynorbornene, or PES.

Figure 3F:
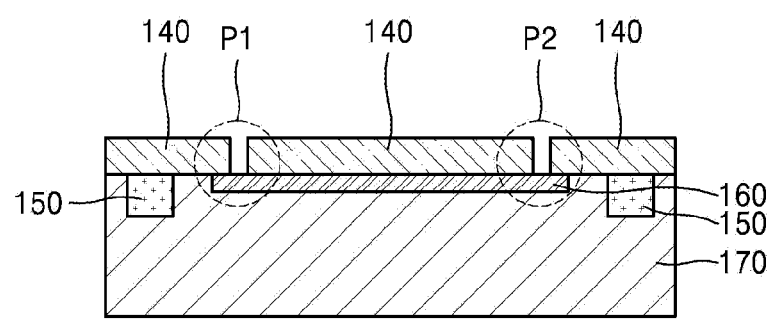

Referring to FIG. 3F, a device of FIG. 3E may be turned upside down, and thus, the buffer layer 190 and the second substrate 180 may be removed therefrom. As the buffer layer 190 is formed of a material that may be removed more easily by etching, the buffer layer 190 may be removed from the dielectric layer 140 relatively easily.

After the buffer layer 190 and the second substrate 180 are removed, the source electrode pattern P1 and the drain electrode pattern P2 may be formed in the dielectric layer 140. The source electrode pattern P1 and the drain electrode pattern P2 may be formed at ends of the 2D material layer 160 from among portions of the dielectric layer 140 that contact the 2D material layer 160.

Figure 3G:
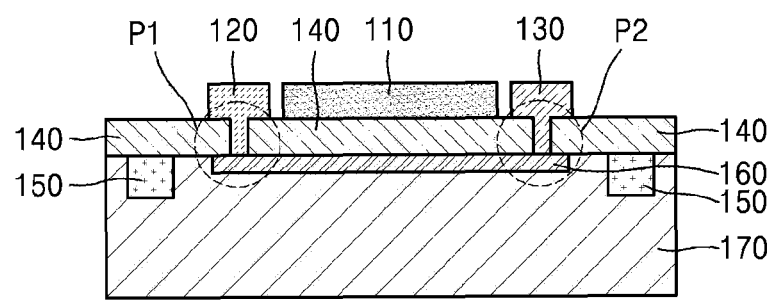

Referring to FIG. 3G, a source electrode 120 and a drain electrode 130 may be formed on the source electrode pattern P1 and the drain electrode pattern P2 on the dielectric layer 140. Each of lower end portions of the source electrode 120 and the drain electrode 130 may be in contact with the 2D material layer 160.

A gate electrode 110 may be formed on the dielectric layer 140 that is formed between the source electrode pattern P1 and the drain electrode pattern P2.

According to the methods of manufacturing a flexible device of FIGS. 2A to 2F and FIGS. 3A to 3G, as the dielectric layer 140 is formed earlier than the 2D material layer 160, a 2D material may be directly formed on the dielectric layer 140, and a change in film quality of the dielectric layer 140 due to an interface problem may be improved. Also, since the dielectric layer 140 and the 2D material layer 160 are formed first, and then, the first substrate 170 including a flexible material that is vulnerable to relatively high temperature is formed, the degree of freedom in performing a relatively high temperature process may be increased when a device is formed.

Figure 4:
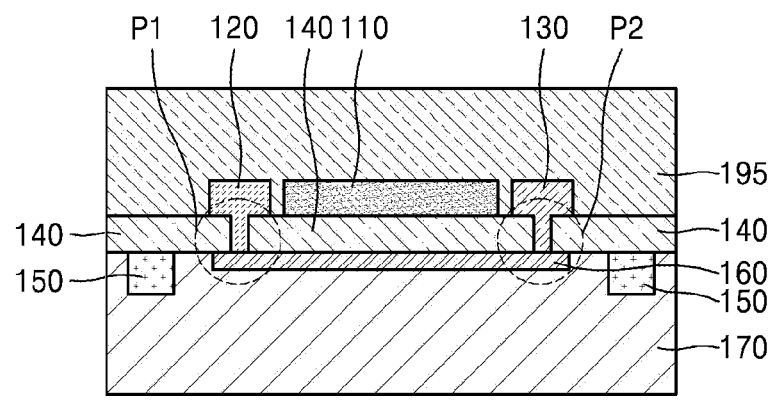
FIG. 4 is a schematic cross-sectional view of a flexible device including a 2D material, e.g., graphene, according to example embodiments.

FIG. 4 is a schematic cross-sectional view of a flexible device including a 2D material, e.g., graphene, according to example embodiments. Referring to FIG. 4, a protective layer 195 may be formed on a dielectric layer 140, a source electrode 120, a drain electrode 130, and a gate electrode 110.

The protective layer 195 may include a flexible material. For example, the protective layer 195 may be formed of PEN, PET, polycarbonate, polyvinylalcohol, polyacrylate, polyimide, polynorbornene, or PES.

According to a flexible device in which 2D materials including graphene are used and a method of manufacturing the flexible device as described above, as a dielectric layer is formed first, a 2D material layer may be directly formed on the dielectric layer, and a change in film quality of the dielectric layer due to an interface problem may be improved.

Further, since a 2D material layer and a dielectric layer are formed first, and then, a flexible substrate vulnerable to relatively high temperature is formed, the degree of freedom in performing a relatively high temperature process may be increased.

It should be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. A method of manufacturing a flexible device, the method comprising:
   forming a dielectric layer on a first substrate;
   forming a two-dimensional (2D) material layer on the dielectric layer;
   forming a pattern in the 2D material layer;
   forming a second substrate on the dielectric layer and the 2D material layer, the second substrate including a flexible material, the 2D material layer having a first surface and a second surface opposing the first surface, the first surface directly contacting the dielectric layer, the second surface directly contacting the second substrate;
   removing the first substrate; and
   after the removing, forming a source electrode pattern and a drain electrode pattern in the dielectric layer, the source electrode pattern and the drain electrode pattern being openings defined in the dielectric layer that are separate from each other;
   forming the source electrode and the drain electrode on the source electrode pattern and the drain electrode pattern, respectively;
   forming a gate electrode on the dielectric layer between the source electrode pattern and the drain electrode pattern; and
   forming an align key on the dielectric layer.

2. The method of claim 1, wherein the forming a dielectric layer forms the dielectric layer on the first substrate including silicon.

3. The method of claim 1, wherein the forming a 2D material layer forms the 2D material layer by one of transferring the 2D material layer on the dielectric layer and directly forming the 2D material layer on the dielectric layer.

4. The method of claim 1, wherein the forming a 2D material layer forms the 2D material layer including at least one of graphene and transition-metal dichalcogenide (TMD).

5. The method of claim 1, further comprising:
   forming a protective layer on the source electrode, the drain electrode, the gate electrode and the dielectric layer, the protective layer including a flexible material.

6. The method of claim 1, wherein the forming an align key forms the align key of metal.

7. A method of manufacturing a flexible device, the method comprising:
   forming a buffer layer on a first substrate,
   forming a dielectric layer on the buffer layer;
   forming a two-dimensional (2D) material layer on the dielectric layer;
   forming a pattern in the 2D material layer;
   forming a second substrate on the dielectric layer and the 2D material layer, the second substrate including a flexible material, the 2D material layer having a first surface and a second surface opposing the first surface, the first surface directly contacting the dielectric layer, the second surface directly contacting the second substrate;

removing the buffer layer and the first substrate; and after the removing, forming a source electrode pattern and a drain electrode pattern in the dielectric layer, the source electrode pattern and the drain electrode pattern being openings defined in the dielectric layer that are separate from each other;

forming the source electrode and the drain electrode on the source electrode pattern and the drain electrode pattern, respectively;

forming a gate electrode on the dielectric layer between the source electrode pattern and the drain electrode pattern; and forming an align key on the dielectric layer.

8. The method of claim 7, wherein the forming a buffer layer forms the buffer layer on the first substrate including silicon.

9. The method of claim 7, wherein the forming a 2D material layer forms the 2D material layer by one of transferring the 2D material layer on the dielectric layer and directly forming the 2D material layer on the dielectric layer.

10. The method of claim 7, wherein the forming a 2D material layer forms the 2D material layer including at least one of graphene and transition-metal dichalcogenide (TMD).

11. The method of claim 7, further comprising:

forming a protective layer on the source electrode, the drain electrode, the gate electrode and the dielectric layer, the protective layer including a flexible material.

12. The method of claim 7, wherein the forming an align key forms the align key of metal.

* * * * *